United States Patent
Schiek et al.

(10) Patent No.: US 11,431,321 B2
(45) Date of Patent: Aug. 30, 2022

(54) HYBRID FILTER

(71) Applicant: RF360 EUROPE GMBH, Munich (DE)

(72) Inventors: Maximilian Schiek, Puchheim (DE); Roland Rosezin, Bernau a. Chiemsee (DE)

(73) Assignee: QUALCOMM Incorporated, San Diego, CA (US)

( * ) Notice: Subject to any disclaimer, the term of this patent is extended or adjusted under 35 U.S.C. 154(b) by 28 days.

(21) Appl. No.: 16/772,122

(22) PCT Filed: Dec. 19, 2018

(86) PCT No.: PCT/EP2018/085957
§ 371 (c)(1),
(2) Date: Jun. 11, 2020

(87) PCT Pub. No.: WO2019/121991
PCT Pub. Date: Jun. 27, 2019

(65) Prior Publication Data
US 2021/0075399 A1   Mar. 11, 2021

(30) Foreign Application Priority Data

Dec. 21, 2017   (DE) .......................... 102017130924.1

(51) Int. Cl.
| | | |
|---|---|---|
| *H03H 9/54* | (2006.01) | |
| *H03H 9/05* | (2006.01) | |
| *H03H 7/075* | (2006.01) | |
| *H03H 9/58* | (2006.01) | |
| *H03H 9/60* | (2006.01) | |

(52) U.S. Cl.
CPC ............ *H03H 9/542* (2013.01); *H03H 7/075* (2013.01); *H03H 9/0561* (2013.01); *H03H 9/0571* (2013.01); *H03H 9/589* (2013.01); *H03H 9/605* (2013.01)

(58) Field of Classification Search
CPC ...... H03H 9/542; H03H 7/075; H03H 9/0561; H03H 9/0571; H03H 9/589; H03H 9/605; H03H 9/0547; H03H 9/0552; H03H 9/0557; H03H 9/0523
USPC ......................................... 333/133, 187, 188
See application file for complete search history.

(56) References Cited

U.S. PATENT DOCUMENTS

| 2014/0035702 A1 | 2/2014 | Black et al. |
| 2017/0077079 A1 | 3/2017 | Lan et al. |
| (Continued) | | |

FOREIGN PATENT DOCUMENTS

| DE | 102004045179 A1 | 3/2006 |

OTHER PUBLICATIONS

International Search Report and Written Opinion dated May 17, 2019, corresponding to Application No. PCT/EP2018/085957.

*Primary Examiner* — Rakesh B Patel
*Assistant Examiner* — Jorge L Salazar, Jr.
(74) *Attorney, Agent, or Firm* — Patterson + Sheridan LLP

(57) ABSTRACT

The invention combines two filter technologies on a single device using the same substrate there for. On this substrate a filter circuit is arranged that has a ladder-type or a lattice arrangement of series and parallel impedance elements to provide a hybrid filter having for example a band pass function. The impedance elements are chosen from BAW resonators and LC elements.

20 Claims, 3 Drawing Sheets

(56) References Cited

U.S. PATENT DOCUMENTS

2017/0141756 A1 5/2017 Yun et al.
2018/0006632 A1* 1/2018 Yi .......................... H03H 9/105

* cited by examiner

HYBRID FILTER

CROSS-REFERENCE TO RELATED APPLICATIONS

This application is a national stage application under 35 U.S.C. 371 of PCT/EP2018/085957, filed Dec. 19, 2018, which claims the benefit of German Application No. 10 2017 130 924.1, filed Dec. 21, 2017, both of which are incorporated herein by reference in their entireties.

Acoustic filters classically have a ladder-type or a lattice structure. In the ladder-type structure series resonators and shunt resonators are combined to generate a desired filter function e.g. a band pass function. In lattice structures, two series signal lines with series resonators are interconnected with parallel branches wherein parallel resonators are arranged respectively. An achievable bandwidth of such filter structures can be estimated to be about two times the pole-zero distance (PZD) of the used resonator. Standard topologies of such filter structures use SAW resonators or BAW resonator, both comparable in their PZD. BAW resonators are preferred at frequencies of more than 2 GHz and in all cases where high power signals are to be handled due to their higher power resistance when compared with SAW resonators.

For recently emerging high frequency, high bandwidth applications, the requirements exceed the achievable performance of these standard structures. Thus, non-standard topologies are required.

LC elements may also be used for forming filter structures. Though the bandwidth of LC filters is higher, but due to the lower Q factor the pass band that is achievable has skirts that are less steep than those of the acoustic resonators in SAW or BAW technology.

To further improve the performance of the critical skirt of filter pass band, acoustic resonators are used in combination with LC elements to enhance the steepness of the skirt thereby maintaining the high bandwidth.

A recent approach to improve the quality of LC elements is described in the published patent application US 2017/0077079 A1. There, a glass substrate is used for building up high Q LC elements in a multi-level metallization embedded in a dielectric. Vias are used to interconnect different metallization levels and to improve the integration factor. In the following context these LC elements are called POG elements (passives on glass) and the relating manufacturing process is called a POG process.

On the other side, BAW filters are usually formed on semiconductor wafers for possible integration of semiconductor devices therein.

Hence, forming a hybrid filter by combining a BAW structure and an LC structure leads to the disadvantage of two distinct and thus separate substrates for realizing the combination. Two dies are required leading to a significant area consumption which may be critical in mobile or handheld devices.

It is an object of the present invention to provide a filter that overcomes the above mentioned problems.

This and other objects are met by a hybrid filter according to claim 1. Further embodiments of the invention are subject of further claims.

The general idea of the invention is to combine the two technologies on a single device using the same substrate there for. On this substrate a filter circuit is arranged that has a ladder-type or a lattice arrangement of series and parallel impedance elements. The impedance elements are chosen from BAW resonators and LC elements. The LC elements comprise at least a metal-isolator-metal capacitor (MIM-capacitor) and a coil. The LC elements are formed from a multi-level metallization. Each level of said multi-level metallization comprises at least one LC element embedded in a dielectric. LC elements that are formed in the same metallization level are electrically connected by conductor lines. These lines may be formed in parallel with the LC elements in an integrated process. LC elements that are formed in different metallization levels are interconnected by vias. These conductor lines and vias may also be used to connect the LC elements to the BAW resonators on the same wafer dependent on whether they are arranged in the same or in different planes of the device.

This new approach leads to a reduction of required overhead, that is to reduced connection effort, reduced number of solder pads and smaller conductor lines and hence reduced resistance and thus, reduced electrical losses. Also area consumption is reduced compared to a solution using two different wafers as substrates.

A preferred substrate for realizing LC elements thereon is a glass wafer. Those wafers are non-conducting and can be provided with a plane and even surface. The glass substrate is also very beneficial for building BAW resonators thereon. In current BAW processing silicon wafers are used for example which are specially treated to reduce their conductance. A substrate made of a glass wafer offers a further reduction in parasitic conductance.

However, if any BAW process should require a silicon wafer which is compatible to a standard semiconductor process, the POG process can also be conducted on such another substrate that is usually used for BAW devices. In any of the two methods only one substrate is required and the necessary area for the whole device is reduced to the area of the bigger one of the two structures that are formed in different technologies.

In a preferred embodiment the LC elements are embodied as passives on glass (POG) as described in the already mentioned US patent application. Hence, the LC elements are formed on the glass substrate in two or more metallization levels embedded in a dielectric. The dielectric may be chosen from an organic material or a dielectric ceramic material like silicon oxide and similar materials.

Due to the total embedding of the LC elements within a dielectric layer the surface thereof may be planarized in a later step to provide a plane surface useful for arranging BAW structures thereon. A further advantage is achieved if the POG elements are covered with an additional plane dielectric layer arranged above the LC elements. Directly on said plane the BAW resonators are formed. The BAW resonators may be formed in any of the two currently used designs. They may be formed in SMR (solidly mounted resonator) technology or as a membrane type resonator suspended over an air gap.

SMR devices need a Bragg mirror to keep the acoustic energy within the BAW device. Such an acoustic Bragg mirror is formed as a set of at least two alternating layers of relatively high and relatively low acoustic impedance that is usually of a metal and a dielectric.

In an alternative embodiment the BAW resonators are formed on the surface of the substrate. On top of the BAW resonators interconnected in a ladder-type or lattice structure at least a top acoustic Bragg mirror is formed. This mirror serves an interface for LC elements that are formed on this mirror. In this way the acoustic energy is kept within the BAW resonators and the mass load of structures deposited on the mirror have no impact on the acoustics of the BAW resonators.

In a further embodiment the LC elements and the BAW resonators are formed on opposite surfaces of the same substrate. In this variant of the filter circuit the LC elements can be electrically connected with the BAW resonators by vias that are guiding through the substrate. One of the two top surfaces can be used to form external contact pads thereon. However, as the BAW resonators are sensitive to mechanical stress, a flip-chip mounting of the filter device is preferred such that the BAW resonators are facing the printed circuit board that the filter device is mounted on. The LC elements embodied as POG elements are not as sensitive to mechanical load impacting thereon and hence the top surface of the POG can be used as a top surface of the filter device.

According to a further embodiment all passive LC elements are formed adjacent to the BAW resonators on the same surface of the substrate.

In those embodiments that need a stacked arrangement of passive LC elements and BAW resonators the interface between the two types of elements is sensitive for a quality and other properties of the device. It is preferred that a plane dielectric layer is arranged at the interface between the multi-level metallization and the layer with the BAW resonators. A preferred dielectric is a silicon oxide layer which can easily be polished to make the surface as plane and even as possible.

In an embodiment all external contact pads of the filter circuit are arranged on the top surface of the BAW resonators, i.e. the surface of the layer containing the BAW resonators.

According to an embodiment the LC elements comprise a metal-isolator-metal capacitor as a series impedance element and a coil as a parallel impedance element of the ladder-type or lattice-type arrangement. Preferably, these elements are formed and arranged in different metallization levels of the POG arrangement. The coil may be embodied as a planar coil or a three-dimensional coil. While the planar coil can be formed within one metallization level, the three-dimensional coil comprises half windings in two different metallization levels interconnected by vias through the separating dielectric. In these cases parts of the three-dimensional coil may be formed in the same metallization level as the capacitor.

While the LC elements are embedded in a dielectric, the BAW resonators need a kind of protection against mechanical impact and mass load. A preferred method is a thin-film package that provides an air gap above the BAW resonator by depositing and structuring a sacrificial layer, covering the sacrificial layer by a rigid capping layer and removing the sacrificial layer through an opening of the capping layer to leave a cavity that provides an air gap between the capping layer and the top surface of the BAW resonators, i.e. the top electrode of the resonators.

In the following the invention is explained in more detail by reference to specified embodiments and the accompanying figures. The figures are schematic only and not drawn to scale. Hence, some details may be depicted enlarged for better understanding.

Figure 1:
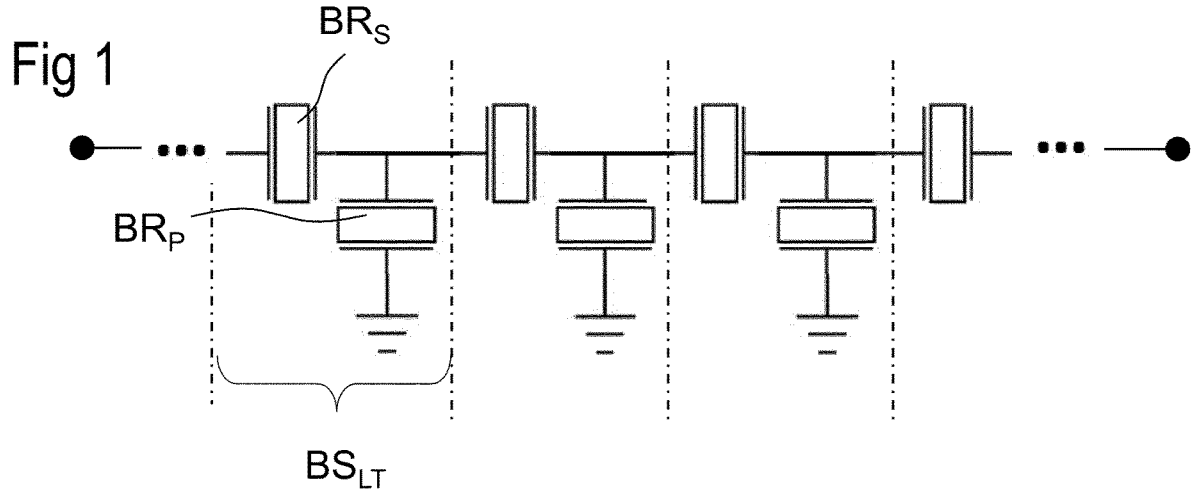
FIG. 1 shows a block diagram of a ladder-type arrangement of resonators.

FIG. 1 is a schematic block diagram of a ladder-type arrangement of resonators. The resonators may be embodied in any technique, for example as acoustic resonators like BAW or a SAW resonators. The ladder-type structure can also comprise LC resonators, i.e. series connection of a capacitor and a coil.

The ladder-type structure comprises a number of basic sections $BS_{LT}$ and each basic section comprises at least a series resonator $BR_S$ and a parallel resonator $BR_P$ as well. Such basic sections $BS_{LT}$ may be connected in series in a number that is necessary to achieve a desired filter function and selectivity. It is possible to realize a series of different filter functions with such a ladder type arrangement of resonators. Examples are bandpass, high pass and low pass as well as combined filters like an extractor, duplexer or multiplexer. Series resonators $BR_S$ that belong to neighbored basic sections, may be combined to a common series resonator $BR_S$ as well as parallel resonators $BR_P$ may also be combined if they are directly neighbored and belonging to different basic sections $BS_{LT}$.

Figure 2:
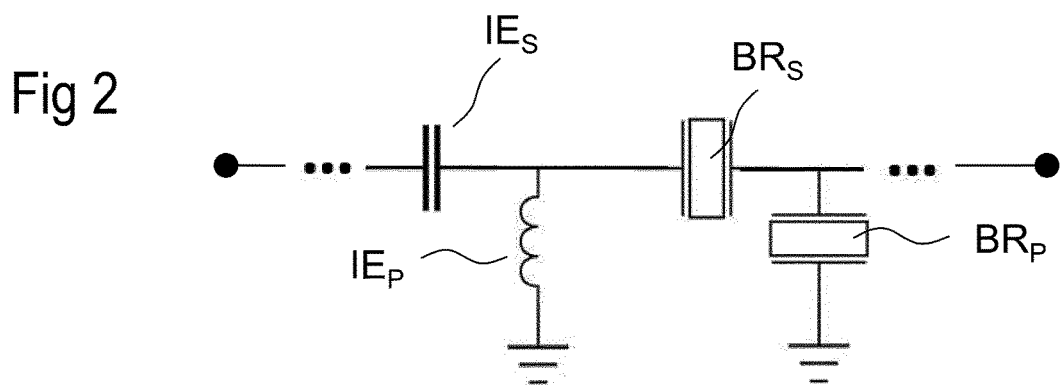
FIG. 2 shows a block diagram of a filter circuit comprising LC elements and acoustic resonators.

FIG. 2 is a schematic block diagram of a filter comprising LC elements and acoustic resonators as well. Depicted is only a fragmentary section of a possible filter structure comprising a series impedance element $IE_S$ and a parallel impedance element $IE_P$ formed as a series capacitor and a parallel coil. These LC elements or impedance elements IE are connected in series with one or more basic sections of an acoustic ladder-type structure. The figure shows one series BAW resonator $BR_S$ and one parallel BAW resonator $BR_P$. A real filter circuit can comprise a higher number of impedance elements IE or resonators that may be interconnected in an arbitrary combination. Such a filter circuit need not be separated in a section comprising only LC elements and a section comprising only acoustic resonators but can also comprise alternating sections of LC elements and acoustic resonators.

Figure 3:
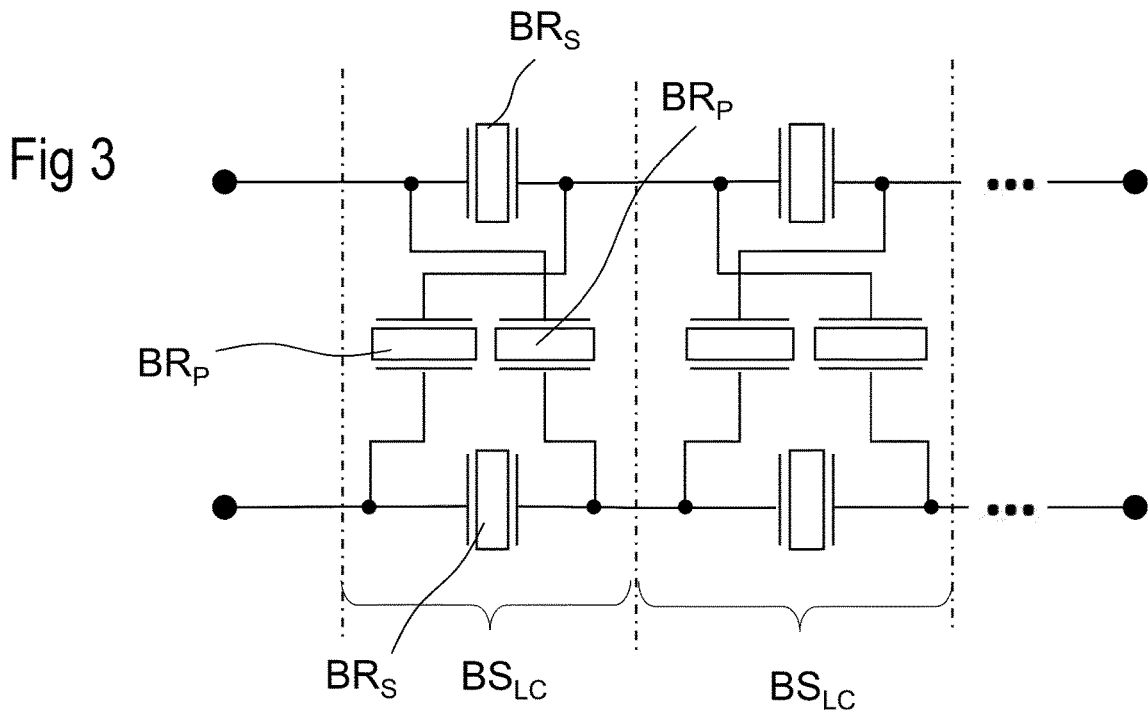
FIG. 3 shows a block diagram of a filter circuit of e.g. acoustic resonators in a lattice structure.

FIG. 3 shows a schematic block diagram of a lattice structure that may be embodied from acoustic resonators BR. A lattice arrangement comprises two series signal lines with series resonators $BR_S$ arranged therein. Parallel branches interconnect both signal lines in a crossover arrangement. A parallel resonator $BR_P$ is arranged in each parallel branch respectively. Hence, a basic section $BS_{LC}$ of the lattice arrangement comprises two series resonators $BR_S$ and two parallel branches comprising a respective parallel resonator $BR_P$. The lattice structure may comprise a number of such basic sections $BS_{LC}$ to achieve a desired filter function.

BAW resonators used in a filter circuit as shown in any of FIGS. 1 to 3 may be cascaded to improve the power resistance thereof. Cascading means a series connection of two or more resonators that behave like a single resonator. This requires adapting the resonator area for keeping the static capacitance $C_S$ constant when cascading a BAW resonator. A twofold cascaded resonator comprises two series connected resonators each of a double area of a normal uncascaded resonator.

Figure 4:
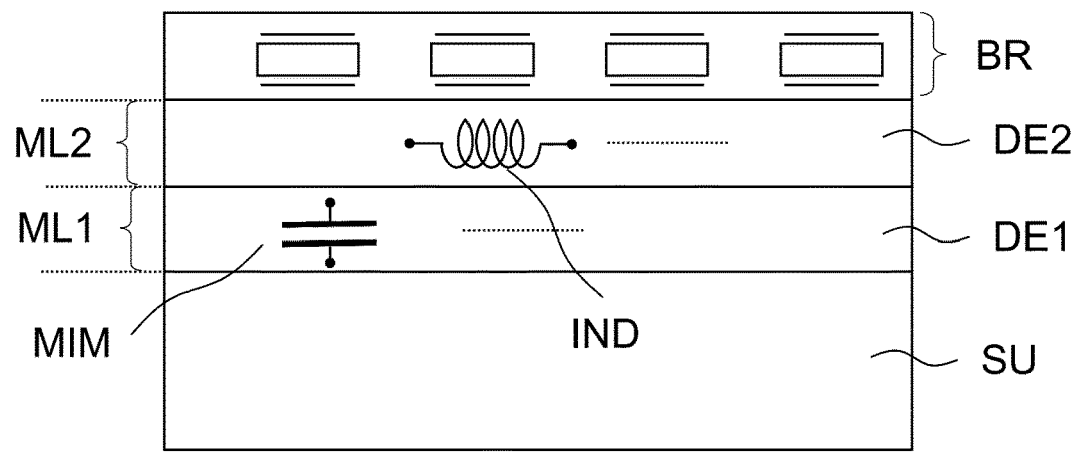
FIG. 4 shows a schematic cross-section through a hybrid filter according to a first embodiment of the invention.

FIG. 4 shows in a more detailed but still schematic depiction a first embodiment how a combined filter of the block diagram according to FIG. 2 can be realized in a common arrangement. The resulting hybrid filter is depicted with only few elements to show a principal structure of the stacked arrangement comprising different kinds of elements.

On a substrate SU that is preferably a plane glass substrate, first LC elements are formed and embedded in a first dielectric DE1. In the figure the LC element is embodied as a metal-isolator-metal capacitor MIM that is a first metal structure covered by a dielectric layer DL and a further metal structure as a second capacitor electrode.

Above the first dielectric DE1 a second metallization level ML2 is formed, structured and embedded in a second dielectric DE2. One element structured in the second metallization level may be the top electrode of the capacitor MIM. Further, a coil IND is structured from the second metallization level ML2. For forming a planar coil IND a single mask step is used to structure the second metallization level accordingly.

The metal structures may be made of AL or an AlCu alloy. The dielectric layer DL may be an oxide like silicon oxide.

Above the first dielectric DE1 a second metallization level ML2 is formed, structured and embedded in a second dielectric DE2. One element structured in the second metallization level may be the top electrode of the capacitor MIM. Further, a coil IND is structured from the second metallization level ML2. For forming a planar coil IND a single mask step is used to structure the second metallization level ML2 accordingly.

Structuring a metallization level ML can be done by first forming and structuring a resist mask and then depositing a metal in areas exposed by the resist mask. Deposition of a metal may be done by plating a metal onto a seed layer that is applied onto the entire surface of substrate SU for the first metallization level or onto the first dielectric DE1 or a higher stack level of dielectric. After the plating step the resist mask is removed thereby exposing remaining seed layer areas that are then removed as well.

A three-dimensional coil IND (not shown in the figure) needs to be formed within two neighboured metallization levels. One of them may the first metallization level ML1.

For interconnecting the two metallization levels ML1, ML2 a respective metallization in the lower metallization level ML1 is exposed by forming an opening in the top surface of the first dielectric DE1. Structures of the second metallization level ML2 applied thereon can now contact respective structures in the first metallization level ML1. All structures that need not have an electrical inter-level connection are isolated against each other by the first dielectric DE1.

Above the at least two level arrangement of LC elements an acoustic section AS with BAW resonators BR are arranged in a ladder-type or lattice structure to form a hybrid filter. The BAW resonators BR may be formed in any known technique as SMR resonators or as FBARs on a membrane.

The figure does not show an exact filter circuit but only indicates the presence of a respective number of BAW resonators BR. Further, various filter functions as mentioned above in connection with FIG. 1 can be realized with such a hybrid filter.

In FIG. 4 no interconnection between the different stacked layers is shown. Required interconnections may be formed as vias. Further, a dielectric layer may be arranged at the interface between the acoustic section AS and the topmost dielectric layer DE2. The hybrid filter may comprise more than the depicted two dielectric layers DE.

Figure 5:
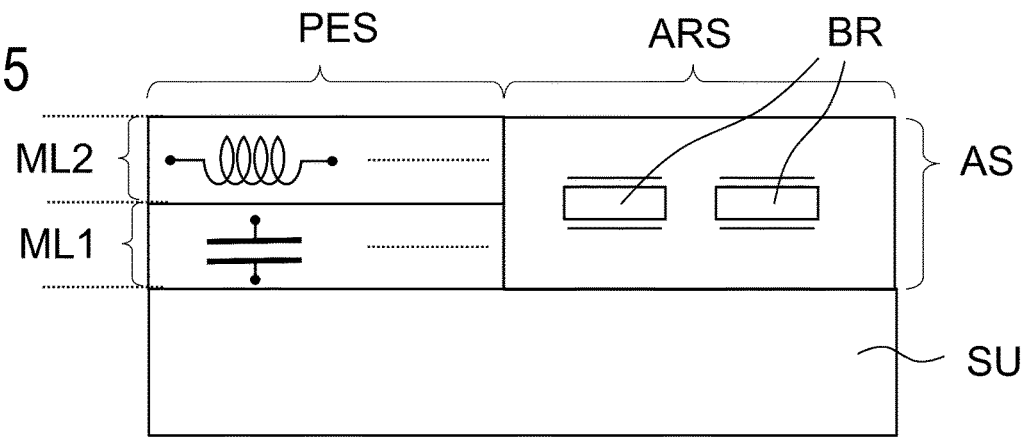
FIG. 5 shows a schematic cross-section of a second embodiment.

FIG. 5 shows a quite different arrangement of LC elements and acoustic resonators formed as BAW resonators BR. Here, both types of elements are arranged directly on the same surface of a common substrate SU. This means, starting from an LC arrangement on a glass substrate, for example according to the known POG structures, acoustic resonators BR are arranged on the remaining free surface of the substrate SU. Hence, the passive impedance element section PES is directly adjacent to the acoustic resonator section BRS. Here too, the passive impedance element section PES may comprise two or more metallization levels ML.

Figure 6:
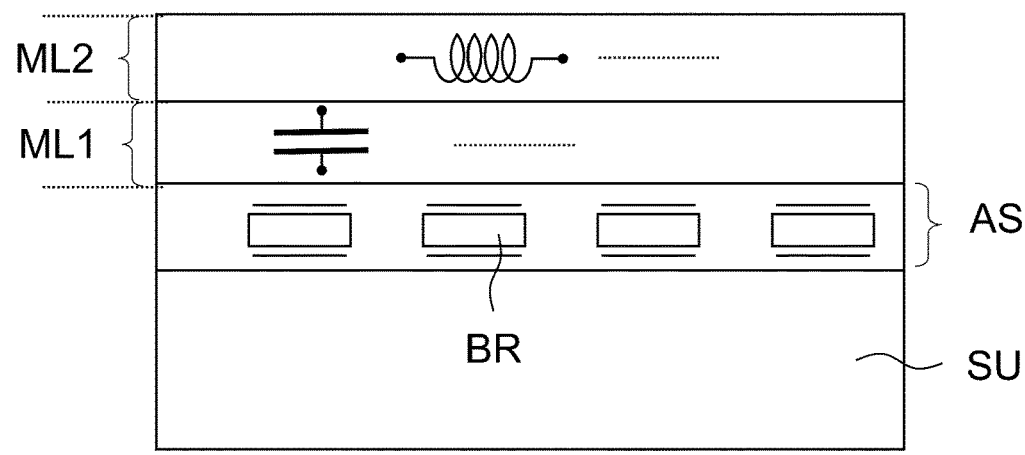
FIG. 6 shows a schematic cross-section through a hybrid filter according to a third embodiment.

FIG. 6 shows a schematic cross-section through a third embodiment. The hybrid filter starts with a substrate SU onto which an arrangement of BAW resonators BR is formed. The resonators may be packaged in a thin-film package or provided with a top acoustic mirror deposited onto the top electrode of the BAW resonators. Both alternatives are to protect the acoustic resonator section from a mass load induced by further layers deposited onto the acoustic resonator section. In both cases a planarizing step is preferred before depositing any other element onto the resonator section. Planarizing can be done by applying a dielectric of sufficient thickness that can be planarized by chemical mechanical polishing, for example. Onto this dielectric LC elements for example embodied as POG elements according to the method disclosed in the above-mentioned US patent application can be formed.

Figure 7:
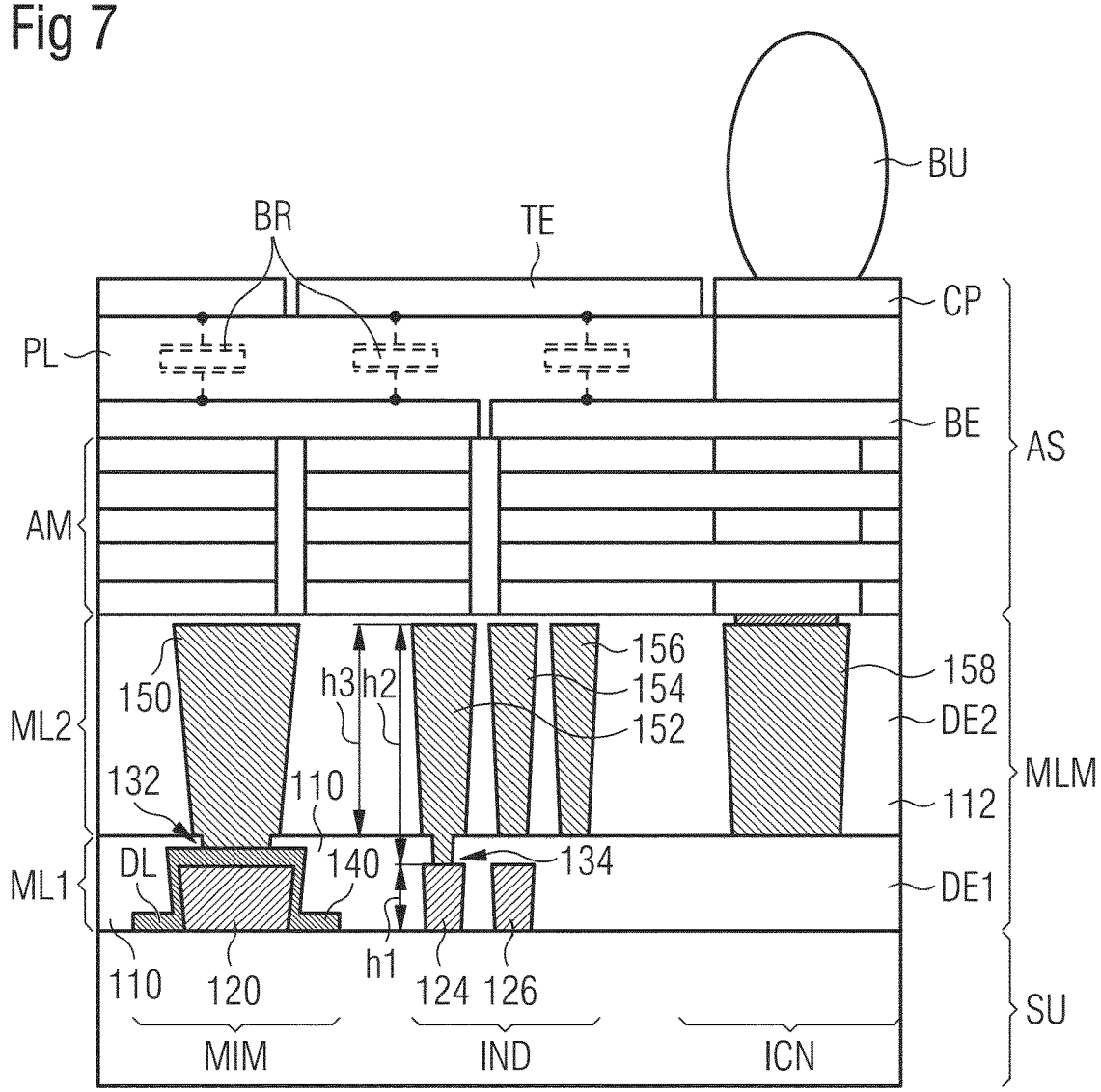
FIG. 7 shows a more detailed cross-section through a hybrid filter according to the first embodiment.

FIG. 7 shows a schematic cross-section through a hybrid filter where the passive elements and the acoustic resonators are depicted in more detail. The structure complies with the first embodiment shown in FIG. 4 and starts with a known POG arrangement on a glass substrate SU. The multi-level metallization MLM can comprise more than the two depicted levels ML1 and ML2. The POG elements form part of a filter circuit providing the hybrid characteristic. The first metallization level ML1 is embedded in a first dielectric DE1. The first metallization level ML1 comprises at least a bottom electrode of an MIM capacitor covered by a dielectric layer DL that is usually different from the embedding dielectric DE1. Further, the first metallization level ML1 may comprise parts of a coil IND as well as connecting in-plane conductor lines for completing the circuiting of the LC elements.

On top of the first dielectric DE1 a second metallization level ML2 is provided to comprise at least the top electrode of the capacitor MIM and at least parts of a coil IND. A second dielectric DE2 covers all structures of second metallization level ML2 thereby embedding same.

Interconnections between the two metallization levels ML1 and ML2 can be provided by exposing metal structures of the first metallization level ML1 by removing respective parts of the first dielectric DE1 in an area where the interconnect is desired. In the figure, the first two structures from the left of the second metallization level ML2 are in depicted to be in contact with a respective structure of the first metallization level ML1.

On the top surface of the second dielectric DE1 or on the top surface of the topmost dielectric (only two layers of dielectric DE are shown) a planarized dielectric layer is arranged. This layer may be formed as a silicon dioxide layer.

The acoustic section AS comprises an acoustic Bragg mirror AM and BAW resonators BR of the SMR type. Such a Bragg mirror is comprised of layers that have alternating high or low acoustic impedance. The high impedance layer of the acoustic mirror AM may comprise metals and hence needs to be structured to avoid coupling of adjacent capacitors. The low impedance mirror layers are usually formed of a dielectric like an oxide.

On top of the acoustic mirror AM a bottom electrode BE of the BAW resonator is formed and structured. Onto the bottom electrode BE a piezoelectric layer PL is applied that may remain continuous and need not be structured. On top of the piezoelectric layer PL the top electrode TE is formed and structured. The structuring of bottom electrode BE and top electrode TE leads to an integrated interconnection or circuiting of the BAW resonators BR that are indicated in the figure by the according equivalent symbols.

On the right side of the figure, electrical interconnection ICN is schematically depicted by metal structures that go through at least the acoustic mirror AM and through at least one layer of a dielectric DE. On top of the interconnection ICN a contact pad CP for external electrical connection of the hybrid filter is formed. The hybrid filter may be connected by means of a bump BU for example to an external circuitry like a printed circuit board for example.

Figure 8:
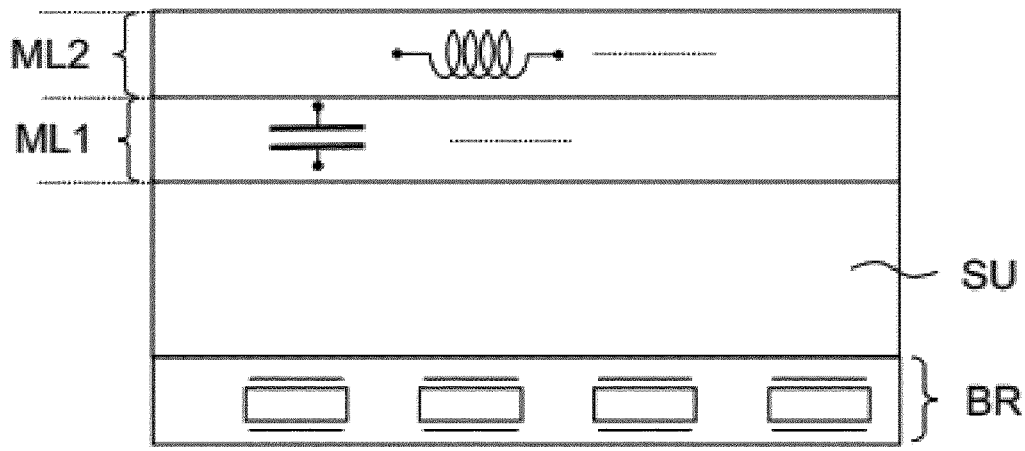
FIG. 8 shows a schematic cross-section through a fourth embodiment where the resonator section and the LC elements are arranged on opposite surfaces of the substrate.

FIG. 8 shows a schematic cross-section through a fourth embodiment of the invention. Manufacturing the arrangement of this embodiment may start with a BAW wafer comprising a filter circuit of acoustic resonators BR. The resonators BR may be formed on an isolating substrate SU, preferably a glass substrate. Onto the opposite surface of the substrate a multi-level metallization including interconnected LC elements embodied as POG elements may be formed according to the foregoing examples and embodiments.

External contact of the hybrid filter may be formed by contact pads on top of the POG section or alternatively on top of the acoustic resonator section comprising the BAW resonators BR. The LC elements and the BAW resonators BR are interconnected by vias through the substrate (not shown in the figure).

The invention has been explained by a limited number of examples only and is thus not restricted to these examples. The invention is defined by the scope of the claims and may deviate from the provided embodiments.

Such further embodiments may comprise further details not shown in the presented embodiments. Further, the hybrid filter may comprise an arbitrary circuit of LC elements and BAW resonators that provide a desired filter function.

LIST OF USED TERMS AND REFERENCE SYMBOLS filter circuit
conductor line
top acoustic mirror
AM (bottom) acoustic mirror
ARS acoustic resonator section
AS acoustic section
BE bottom electrode
BR BAW resonator
$BS_{LC}$ basic section of lattice arrangement
$BS_{LT}$ basic section of ladder-type arrangement
BU bump
CP external contact pad
DE dielectric
DL dielectric layer, e.g. silicon oxide layer
ICN interconnect/via
$IE_P$ parallel impedance element
$IE_S$ series impedance element
$IE_S$, $IE_P$ LC element
IND coil
MIM MIM capacitor
ML metallization level
MLM multi-level metallization
PES passive impedance element section
PL piezoelectric layer
SU substrate
TE top electrode

The invention claimed is:

1. A hybrid filter, comprising:
a substrate; and
a filter circuit with a ladder-type or lattice arrangement of series and parallel impedance elements comprising at least one bulk acoustic wave (BAW) resonator and a plurality of LC elements, arranged on the substrate, wherein:
the plurality of LC elements comprise a metal-isolator-metal capacitor and a coil,
the plurality of LC elements are formed from a multi-level metallization,
at least one metallization level of the plurality of LC elements is embedded in a dielectric,
LC elements of the plurality of LC elements that are formed in the same metallization level are electrically connected by conductor lines,
LC elements of the plurality of LC elements that are formed in different metallization levels are interconnected by at least one via,
at least one LC element of the plurality of LC elements is formed on the substrate,
a plane dielectric layer is arranged above the at least one LC element, and
the at least one BAW resonator is formed directly on the plane dielectric layer.

2. The hybrid filter of claim 1, wherein the substrate is a glass substrate.

3. The hybrid filter of claim 1, wherein at least one LC element of the plurality of LC elements is embodied as a passive element on the substrate.

4. The hybrid filter of claim 1, wherein the at least one LC element of the plurality of LC elements and the at least one BAW resonator are formed adjacent to each other on a same surface of the substrate.

5. The hybrid filter of claim 1, wherein the plane dielectric layer comprises a polished silicon oxide layer.

6. The hybrid filter of claim 1, wherein at least one external contacts pad of the filter circuit is arranged on a top surface of the at least one BAW resonator.

7. A hybrid filter of claim 1, comprising:
a substrate; and
a filter circuit with a ladder-type or lattice arrangement of series and parallel impedance elements comprising at least one BAW resonator and a plurality of LC elements, arranged on the substrate, wherein:
the plurality of LC elements comprise a metal-isolator-metal capacitor and a coil,
the plurality of LC elements are formed from a multi-level metallization,
at least one metallization level of the plurality of LC elements is embedded in a dielectric,
LC elements of the plurality of LC elements that are formed in the same metallization level are electrically connected by conductor lines,
LC elements of the plurality of LC elements that are formed in different metallization levels are interconnected by at least one via,
the at least one BAW resonator is formed on a surface of the substrate,
the at least one BAW resonator comprises at least a top acoustic mirror, and at least one LC element of the plurality of LC elements is formed as a passive element on the top acoustic mirror.

8. The hybrid filter of claim 7, wherein the substrate is a glass substrate.

9. The hybrid filter of claim 7, wherein at least one LC element of the plurality of LC elements is embodied as a passive element on the substrate.

10. The hybrid filter of claim 7, wherein at least one LC element of the plurality of LC elements and the at least one BAW resonator are formed adjacent to each other on a same surface of the substrate.

11. The hybrid filter of claim 7, wherein a plane dielectric layer is arranged above at least one LC element of the plurality of LC elements and the plane dielectric layer comprises a polished silicon oxide layer.

12. The hybrid filter of claim 7, wherein at least one external contacts pad of the filter circuit is arranged on a top surface of the at least one BAW resonator.

13. A hybrid filter, comprising:
a substrate; and
a filter circuit with a ladder-type or lattice arrangement of series and parallel impedance elements comprising at least one BAW resonator and a plurality of LC elements, arranged on the substrate, wherein:
the plurality of LC elements comprise a metal-isolator-metal capacitor and a coil,
the plurality of LC elements are formed from a multi-level metallization,
at least one metallization level of the plurality of LC elements is embedded in a dielectric,
LC elements of the plurality of LC elements that are formed in the same metallization level are electrically connected by conductor lines, and
LC elements of the plurality of LC elements that are formed in different metallization levels are interconnected by at least one via, and
at least one LC element of the plurality of LC elements and the at least one BAW resonator are formed on opposite surfaces of the substrate.

14. The hybrid filter of claim 13, wherein a plane dielectric layer is arranged above at least one LC element of the plurality of LC elements and the plane dielectric layer comprises a polished silicon oxide layer.

15. The hybrid filter of claim 13, wherein at least one external contacts pad of the filter circuit is arranged on a top surface of the at least one BAW resonator.

16. The hybrid filter of claim 13, wherein the substrate is a glass substrate.

17. The hybrid filter of claim 13, wherein at least one LC element of the plurality of LC elements is embodied as a passive element on the substrate.

18. A hybrid filter, comprising:
a substrate; and
a filter circuit with a ladder-type or lattice arrangement of series and parallel impedance elements comprising at least one BAW resonator and a plurality of LC elements, arranged on the substrate, wherein:
the plurality of LC elements comprise a metal-isolator-metal capacitor and a coil,
the plurality of LC elements are formed from a multi-level metallization,
at least one metallization level of the plurality of LC elements is embedded in a dielectric,
LC elements of the plurality of LC elements that are formed in the same metallization level are electrically connected by conductor lines,
LC elements of the plurality of LC elements that are formed in different metallization levels are interconnected by at least one via,
the filter circuit comprises the metal-isolator-metal capacitor as a series impedance element and the coil as a parallel reactance element of the ladder-type or lattice type arrangement, and
the at least one BAW resonator and at least one LC element of the plurality of LC elements are interconnected by the at least one via.

19. The hybrid filter of claim 18, wherein at least one LC element of the plurality of LC elements is embodied as a passive element on the substrate.

20. The hybrid filter of claim 18, wherein the substrate is a glass substrate.

* * * * *